(12) United States Patent
Monma et al.

(10) Patent No.: US 7,642,829 B2
(45) Date of Patent: *Jan. 5, 2010

(54) DUTY DETECTION CIRCUIT

(75) Inventors: Atsuko Monma, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/010,670

(22) Filed: Jan. 29, 2008

(65) Prior Publication Data

US 2008/0129358 A1    Jun. 5, 2008

Related U.S. Application Data

(62) Division of application No. 11/346,416, filed on Feb. 3, 2006, now Pat. No. 7,411,435.

(30) Foreign Application Priority Data

Feb. 3, 2005   (JP)   ............... 2005-027483

(51) Int. Cl.
   *H03K 3/017*   (2006.01)
   *H03K 5/04*    (2006.01)
   *H03K 7/08*    (2006.01)

(52) U.S. Cl. .................. 327/175; 327/172; 327/176

(58) Field of Classification Search .......... 327/172–176
   See application file for complete search history.

(56) References Cited

U.S. PATENT DOCUMENTS

| | | | | |
|---|---|---|---|---|
| 6,643,790 | B1 * | 11/2003 | Yu et al. ................. | 713/500 |
| 6,937,485 | B2 * | 8/2005 | Suzuki et al. ............ | 363/41 |

(Continued)

FOREIGN PATENT DOCUMENTS

JP    61-071715    4/1986

(Continued)

OTHER PUBLICATIONS

Korean Office Action issued in Korean Patent Application No. KR 10-2006-0034337, mailed Oct. 23, 2007.

(Continued)

*Primary Examiner*—Lincoln Donovan
*Assistant Examiner*—Patrick O'Neill
(74) *Attorney, Agent, or Firm*—McDermott Will & Emery LLP

(57) ABSTRACT

A duty detection circuit includes an integration circuit for receiving an RCLK signal and an FCLK signal that are internal clock signals generated by a DLL circuit, and generating voltage levels in accordance with the duty ratio of these internal clock signals; an amplifier for amplifying the output of the integration circuit; a latch circuit for latching the output of the amplifier; a control circuit for controlling the operation timings of each component; a bias circuit for feeding a BIAS signal to the integration circuit; and a frequency monitor circuit unit for monitoring the frequency of the clock signal. The frequency monitor circuit unit is a circuit component used when the power source is turned on, during resetting, and when other initial settings are performed, and detects the actual frequency of the clock signal and adjusts the amount of charging or discharging of the capacitors C1 through C4 in the integration circuit according to this actual frequency.

20 Claims, 10 Drawing Sheets

U.S. PATENT DOCUMENTS

| | | | |
|---|---|---|---|
| 6,940,328 B2 * | 9/2005 | Lin | 327/175 |
| 7,180,346 B2 * | 2/2007 | Lee | 327/175 |
| 7,199,634 B2 | 4/2007 | Cho et al. | |
| 7,202,722 B2 * | 4/2007 | Mahadevan et al. | 327/175 |
| 7,411,435 B2 * | 8/2008 | Monma et al. | 327/175 |
| 2001/0046272 A1 * | 11/2001 | Miyano | 375/375 |
| 2002/0017936 A1 | 2/2002 | Stark et al. | |
| 2005/0122149 A1 | 6/2005 | Cho et al. | |

FOREIGN PATENT DOCUMENTS

| | | |
|---|---|---|
| JP | 11-127142 | 5/1999 |
| JP | 2000-163961 | 6/2000 |
| JP | 2001-144590 | 5/2001 |
| JP | 2001-156261 | 6/2001 |
| JP | 2001-308698 | 11/2001 |
| JP | 2002-135105 | 5/2002 |
| JP | 2002-344294 | 11/2002 |
| JP | 2003-110411 | 4/2003 |
| JP | 2003-318705 | 11/2003 |
| JP | 2004-015810 | 1/2004 |
| JP | 2004-145999 | 5/2004 |
| KR | 2005-0055925 | 6/2005 |

OTHER PUBLICATIONS

Japanese Office Action, with English translation, issued in Japanese Patent Application No. JP 2005-027483, mailed Jan. 8, 2008.

Japanese Office Action, with partial English translation, issued in Japanese Patent Application No. JP 2005-117750, mailed Nov. 13, 2007.

Ogawa, T., et al., "A 50% duty control circuit for PLL output", The Institute of Electrical Engineers of Japan- Society for the Study of Electronic Circuits, Oct. 19, 2001, pp. 15-19.

* cited by examiner

DUTY DETECTION CIRCUIT

RELATED APPLICATIONS

This application is a Divisional of U.S. application Ser. No. 11/346,416, filed Feb. 3, 2006 now U.S. Pat. No. 7,411,435, claiming priority of Japanese Application No. 2005-027483, filed Feb. 3, 2005, the entire contents of each of which are hereby incorporated by reference.

TECHNICAL FIELD

The present invention relates to a duty detection circuit, and particularly relates to a duty detection circuit for detecting a duty error in an internal clock, used as part of a DLL (Delay Locked Loop) circuit for generating an internal clock that is synchronized with an external clock.

BACKGROUND OF THE INVENTION

In DDR-SDRAM (Double Data Rate-Synchronous Dynamic Random Access Memory), a DLL (Delay Locked Loop) circuit for generating an internal clock synchronized with an external clock is used in order to minimize operational lag within the memory. The external clock signal must be inputted at the correct duty ratio (ratio of high-level or low-level signals accommodated in one cycle; the correct duty ratio in this case is 50%) in order for the DLL circuit to operate properly. However, since a duty error of ±5% in the external clock signal is allowed by specification, and a larger duty error occurs when jitter and the like are considered, after the duty error of the internal clock is detected by a duty detection circuit, this error must be corrected using a duty correction circuit.

FIG. 8 is a simplified block diagram showing the structure of a conventional duty detection circuit.

As shown in FIG. 8, this duty detection circuit 200 comprises an integration circuit 210 for receiving an RCLK signal and an FCLK signal that are internal clock signals generated by the DLL circuit, and generating voltage levels (DB signal and VREF signal) in accordance with the duty ratio of these internal clock signals (hereinafter referred to simply as clock signals); an amplifier 220 for amplifying the output of the integration circuit 210; and a latch circuit 230 for latching the output of the amplifier 220. The RCLK signal is an internal clock signal having the same phase as the external clock signal, and the FCLK signal is an internal clock signal having the opposite phase of the external clock signal. Therefore, the RCLK signal and the FCLK signal are complementary to each other, and the term "duty ratio" is defined by the ratio at which the RCLK signal is high-level (ratio at which the FCLK signal is low-level).

The integration circuit 210 comprises capacitors C1 and C2 connected to a signal line S1; capacitors C3 and C4 connected to a signal line S2; pre-charge transistors Tr1 through Tr3 for charging (pre-charging) the capacitors C1 and C3; activation transistors Tr4 and Tr5 for allowing the capacitors C1 and C3 to discharge (discharge); integration transistors Tr6 and Tr7 for receiving and switching the RCLK signal and the FCLK signal; and a bias transistor Tr8 inserted between the sources of the integration transistors Tr6 and Tr7 and the ground GND. A PREB ("B" stands for bar; specifically, low-active. This is the same for the ACTB signal) signal that is a pre-charge signal for initiating charging of the capacitors C1 and C3 is fed to the gates of the pre-charge transistors Tr1 through Tr3, and an ACTB signal that is an activation signal for initiating an actual integration operation is fed to the gates of the activation transistors Tr4 and Tr5.

The operation of the conventional duty detection circuit 200 will next be described with reference to FIG. 9. FIG. 9 is a waveform diagram showing the operation of the duty detection circuit 200 when the frequency of the clock signal is appropriate.

As shown in FIG. 9, when the pre-charge transistors Tr1 through Tr3 are placed in the ON state by the changing of the PREB signal to low-level, a charge is fed from the power source VCL to the capacitors C1 through C4. The capacitors C1 and C3 are thereby charged, and the capacitors C2 and C4 are discharged. When the activation transistors Tr4 and Tr5 are placed in the ON state by the changing of the ACTB signal to low-level, the charges with which the capacitors C1 and C3 were charged are alternately discharged in synchrony with the RCLK signal and FCLK signal. In other words, when the RCLK signal becomes high-level, the charge of the capacitor C1 is discharged through the activation transistor Tr4, the integration transistor Tr6, and the bias transistor Tr8; and when the FCLK signal becomes high-level the charge of the capacitor C3 is discharged through the activation transistor Tr5, the integration transistor Tr7, and the bias transistor Tr8. Since the capacitors C1 and C3 are thereby discharged during the period in which the RCLK signal and FCLK signal are each high-level, the potentials of the DB signal and the VREF signal alternately decrease in the period in which the ACTB signal is low-level, as shown in the drawing.

The final output of the integration circuit 210 is indicated by the potential difference between the VREF signal that is the potential of the signal line S1 connected to the capacitors C1 and C2 and the DB signal that is the potential of the signal line S2 connected to the capacitors C3 and C4. The difference between these potentials is amplified by the amplifier 220, whereby a DCC signal (duty correction signal) is obtained that is a 1-bit digital signal, and the DCC signal is latched in the latch circuit 230. In this arrangement, a low-level (VREF>DB) logical value for the DCC signal means that the duty ratio exceeds 50%, and a high-level (VREF<DB) logical value for the DCC signal means that the duty ratio is less than 50%. The DCC signal thus generated is fed back by the main circuit unit of the DLL circuit not shown in the drawing, and the main circuit unit of the DLL circuit changes the duty ratio of the clock signal based on this feedback. In other words, control is performed so that the duty ratio of the clock signal is reduced when the DCC signal is low-level, and so that the duty ratio of the clock signal is increased when the DCC signal is high-level. The DLL circuit causes the duty ratio of the clock signal to approach 50% by continuously performing this type of control.

The conventional duty detection circuit 200 described above has drawbacks whereby abnormal operation occurs when the frequency of the clock signal is too high or too low with respect to the pre-set reference frequency.

For example, when the frequencies of the RCLK signal and FCLK signal are near a prescribed reference frequency, as shown in FIG. 9, since the potentials of the DB signal and the VREF signal both fall within the appropriate operational range in which the amplifier 220 operates with high sensitivity, the duty error can be correctly detected.

However, as shown in FIG. 10, since the amount of discharge of the capacitors C1 and C3 is too small when the frequency of the clock signal is too high, the potential of the DB signal and VREF signal does not adequately decrease, and the level of the DB signal and VREF signal can reach or exceed the limit of the appropriate operational range of the amplifier 220. In such a state, since the potential difference between these signals is small and the difference between the two signals is easily affected by the offset of the amplifier 220 and cannot be adequately amplified, the potential for erroneous determination is high.

Conversely, as shown in FIG. 11, when the frequency of the clock signal is too low, the amount of discharge of the capacitors C1 and C3 is too large. The potential of the DB signal and VREF signal therefore significantly decreases, and the potentials of both the DB signal and the VREF signal can decrease to or become lower than the limit of the appropriate operational range of the amplifier 220 (in certain cases, discharge of the capacitors stops, and the DB signal and VREF signal both decrease to ground level (GND)). In such a state, since the difference between the two signals is also easily affected by the offset of the amplifier 220 and cannot be adequately amplified, the potential for erroneous determination is high.

Thus, in the conventional duty detection circuit 200, an adequate potential difference between the DB signal and the VREF signal is not obtained even when the frequency of the clock signal is too high or too low, and the potential for misjudgment occurring due to the effect of the offset of the amplifier 220 is extremely high. Specifically, the conventional duty detection circuit 200 has drawbacks in being extremely dependent on frequency, and in being usable only in an extremely narrow frequency bandwidth.

Therefore, an object of the present invention is to provide a duty detection circuit capable of operating normally in a wider frequency bandwidth.

SUMMARY OF THE INVENTION

The duty detection circuit according to the present invention is essentially a duty detection circuit for detecting the duty of a clock signal and generating a duty correction signal based on the duty, and comprises an integration circuit that includes first and second capacitors, for alternately charging or discharging the first and second capacitors in synchrony with the clock signal; a duty correction signal outputting circuit unit for detecting the potential difference of the first and second capacitors and outputting a duty correction signal based on the same; and a frequency monitor circuit unit for detecting the frequency of the clock signal. The frequency monitor circuit unit adjusts the amount of charging or amount of discharging of the first and second capacitors according to the frequency of the clock signal. The method used for adjusting the amount of charging or amount of discharging of the first and second capacitors may be a method for changing the charging rate or discharging rate of these capacitors, or may be a method for changing the charging time or discharging time of these capacitors.

BRIEF DESCRIPTION OF THE DRAWINGS

The above and other objects, features and advantages of this invention will become more apparent by reference to the following detailed description of the invention taken in conjunction with the accompanying drawings.

DETAILED DESCRIPTION OF THE EMBODIMENTS

Preferred embodiments of the present invention will be described in detail hereinafter with reference to the accompanying drawings.

Figure 1:
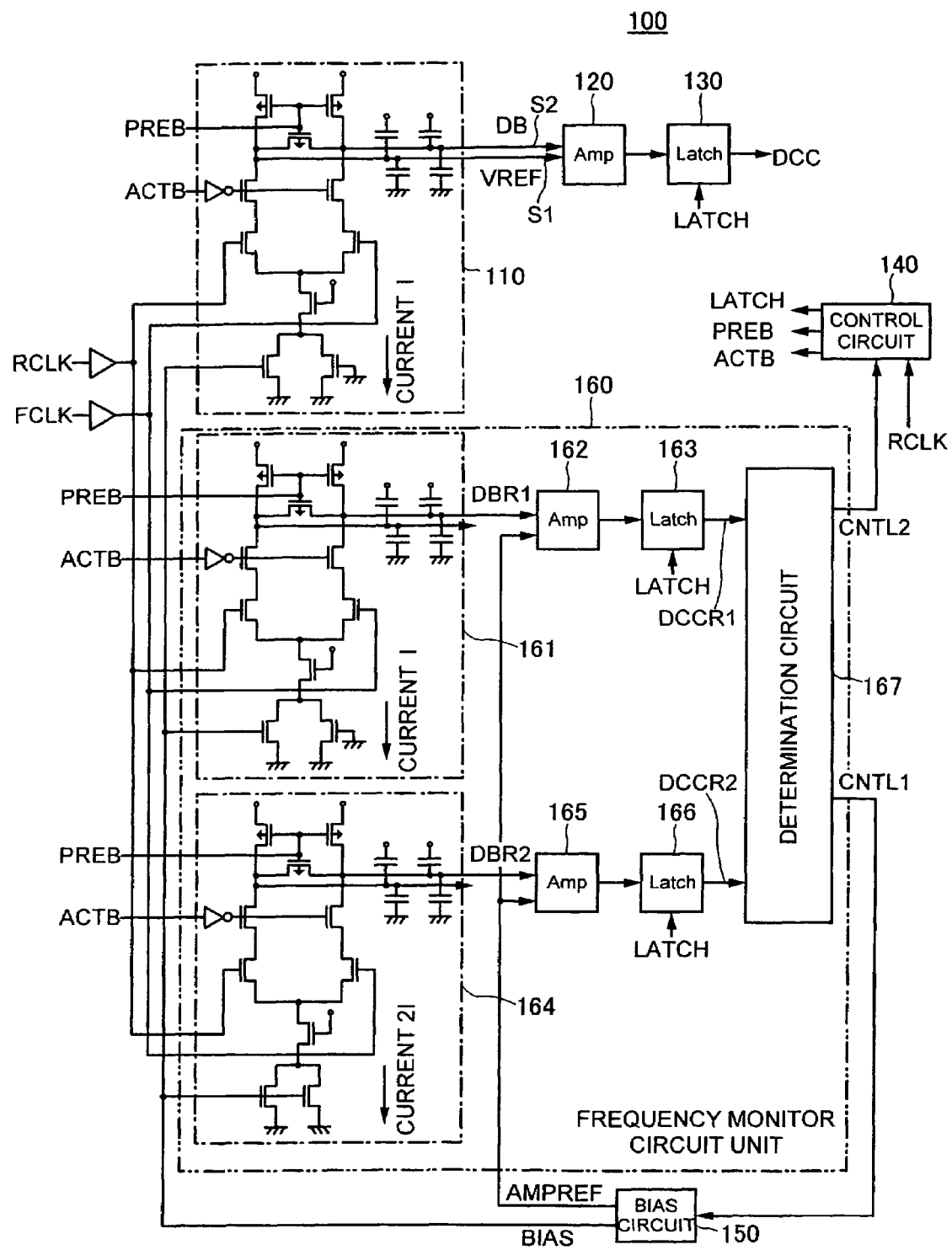
FIG. 1 is a schematic block diagram showing the structure of the duty detection circuit according to an embodiment of the present invention.

FIG. 1 is a schematic block diagram showing the structure of the duty detection circuit according to an embodiment of the present invention.

As shown in FIG. 1, the duty detection circuit 100 according to the present embodiment comprises an integration circuit 110 for receiving an RCLK signal and an FCLK signal that are internal clock signals generated by a DLL circuit, and generating voltage levels (DB signal and VREF signal) in accordance with the duty ratio of these internal clock signals (hereinafter referred to simply as clock signals); an amplifier 120 for amplifying the output of the integration circuit 110; a latch circuit 130 for latching the output of the amplifier 120; a control circuit 140 for controlling the operation timings of each component based on the RCLK signal; a bias circuit 150 for generating a BIAS signal and an AMPREF signal; and a frequency monitor circuit unit 160 for monitoring the frequency of the clock signal.

Figure 2:
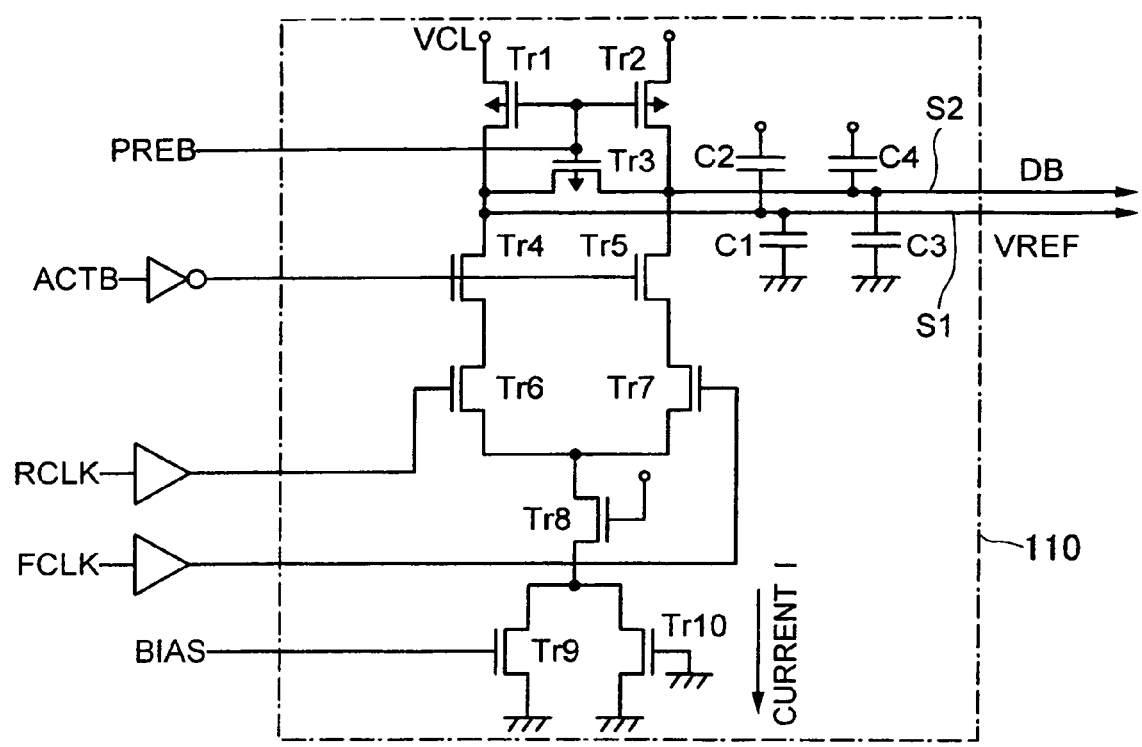
FIG. 2 is a circuit diagram showing the detailed structure of the integration circuit 110.

FIG. 2 is a circuit diagram showing the detailed structure of the integration circuit 110.

As shown in FIG. 2, the integration circuit 110 comprises capacitors C1 and C2 connected to a signal line S1; capacitors C3 and C4 connected to a signal line S2; pre-charge transistors Tr1 through Tr3 for pre-charging the capacitors C1 and C3; activation transistors Tr4 and Tr5 for allowing the capacitors C1 and C3 to discharge; integration transistors Tr6 and Tr7 for receiving the RCLK signal and the FCLK signal and switching; and bias transistors Tr8 through Tr10 inserted between the sources of the integration transistors Tr6 and Tr7 and the ground GND.

Since the capacitors C1 and C2 are each connected at one end thereof to the signal line S1, and the other ends thereof are connected to the power source VCL and the ground GND, respectively, the potential of the signal line S1 becomes any potential from the VCL to zero according to the charge/discharge state of the capacitors C1 and C2. The potential of the signal line S1 is fed to the amplifier 120 as the VREF signal. In the same manner, since the capacitors C3 and C4 are each connected at one end thereof to the signal line S2, and the other ends thereof are connected to the power source VCL and the ground GND, respectively, the potential of the signal line S2 becomes any potential from the VCL to zero according to the charge/discharge state of the capacitors C3 and C4. The potential of the signal line S2 is fed to the amplifier 120 as the DB signal.

The first signal line S1 and the second signal line S2 are each connected to the power source VCL via the pre-charge transistors Tr1 and Tr2. Therefore, when these pre-charge transistors Tr1 and Tr2 are ON, both the first signal line S1 and the second signal line S2 are pre-charged to the same potential as the power source VCL. The pre-charge transistor Tr3 is provided in order to create a charge balance by short-circuiting the two signal lines S1 and S2. These pre-charge transistors Tr1 through Tr3 are composed of P-channel-type MOS transistors, and a PREB signal is fed to each gate electrode thereof.

The activation transistors Tr4 and Tr5 are switches for allowing a discharge via the integration transistors Tr6 and Tr7. The "integration operation time period" during which the activation transistors Tr4 and Tr5 are ON is specified by an integer multiple (=nT, wherein n is a non-negative integer) of the cycle time T of the clock signal. The activation transistors Tr4 and Tr5 are composed of N-channel-type MOS transistors, an inverted signal of the ACTB signal is fed to each gate electrode thereof, and the activation transistors Tr4 and Tr5 are activated when the ACTB signal is "Low."

The integration transistors Tr6 and Tr7 are switches for causing the capacitors C1 and C3 to charge in alternating fashion in the integration operation time period, and are connected in series to the activation transistors Tr4 and Tr5, respectively. The integration transistors Tr6 and Tr7 are both composed of N-channel-type MOS transistors, and the RCLK signal and FCLK signal are fed to the gate electrodes thereof, respectively.

The bias transistors Tr8 through Tr10 are transistors for causing a bias current I to flow during the integration operation time period. Among these transistors, the gate of the bias transistor Tr8 is pulled up, and is therefore always in the ON state. The gate of the bias transistor Tr10 is grounded, and is therefore always in the OFF state. Therefore, only the two transistors Tr8 and Tr9 actually serve as bias transistors, and adjustment of the bias current I are performed solely by the bias transistor Tr9. The bias transistor Tr10 is provided in order to create a common circuit structure with the second replica integration circuit 164 described hereinafter. These bias transistors Tr8 through Tr10 are all composed of N-channel-type MOS transistors.

In this type of circuit configuration, the series circuit composed of the capacitor C1, the activation transistor Tr4, the integration transistor Tr6, and the bias transistors Tr8 and Tr9 constitutes an integration circuit with respect to the RCLK signal; and the series circuit composed of the capacitor C3, the activation transistor Tr5, the integration transistor Tr7, and the bias transistors Tr8 and Tr9 constitutes an integration circuit with respect to the FCLK signal.

The integration operation time period of the integration circuit 110 is specified by the active time period (Low) of the ACTB signal. When the integration operation time period is too short, the capacitors C1 and C3 cannot be adequately discharged, and the potential difference between the DB signal and the VREF signal becomes impossible to maintain. Furthermore, there is a risk in this case of at least one of the DB signal and VREF signal becoming higher than the operational range of the amplifier 120, and the voltage between the source and drain of the bias transistor Tr8 can become significantly higher than the level of the BIAS signal. Conversely, when the integration operation time period is too long, the potential of the DB signal and VREF signal becomes too low, and there is a risk of at least one of the DB signal and VREF signal becoming lower than the operational range of the amplifier 120. The voltage between the source and drain of the bias transistor Tr8 can become significantly lower than the level of the BIAS signal in this case as well. The active time period of the ACTB signal; specifically, the integration operation time period, must therefore be set to the appropriate value taking into account these conditions. As described above, the integration operation time period is specified by an integer multiple (=nT) of the cycle time T of the clock signal.

The final output of the integration circuit 110 is indicated by the voltage difference between the VREF signal that is the potential of the signal line S1 connected to the capacitors C1 and C2 and the DB signal that is the potential of the signal line S2 connected to the capacitors C3 and C4. Specifically, this integration circuit 110 can be considered to be a differential circuit for performing voltage conversion of the difference between the time period in which the RCLK signal is high-level and the time period in which the FCLK signal is high-level. The difference between these potentials is amplified by the amplifier 120 and latched by the latch circuit 130, whereby a DCC signal (duty correction signal) that is a 1-bit digital signal is obtained. The DCC signal is fed back by the main circuit unit of the DLL circuit not shown in the drawing, and the main circuit unit of the DLL circuit changes the duty ratio of the clock signal so as to approach 50% based on this feedback. This type of operation is repeatedly executed during normal operation.

The operation of the integration circuit 110 having the type of configuration described above will be described with reference to the operational waveform diagrams in FIGS. 3 and 4.

Figure 3:
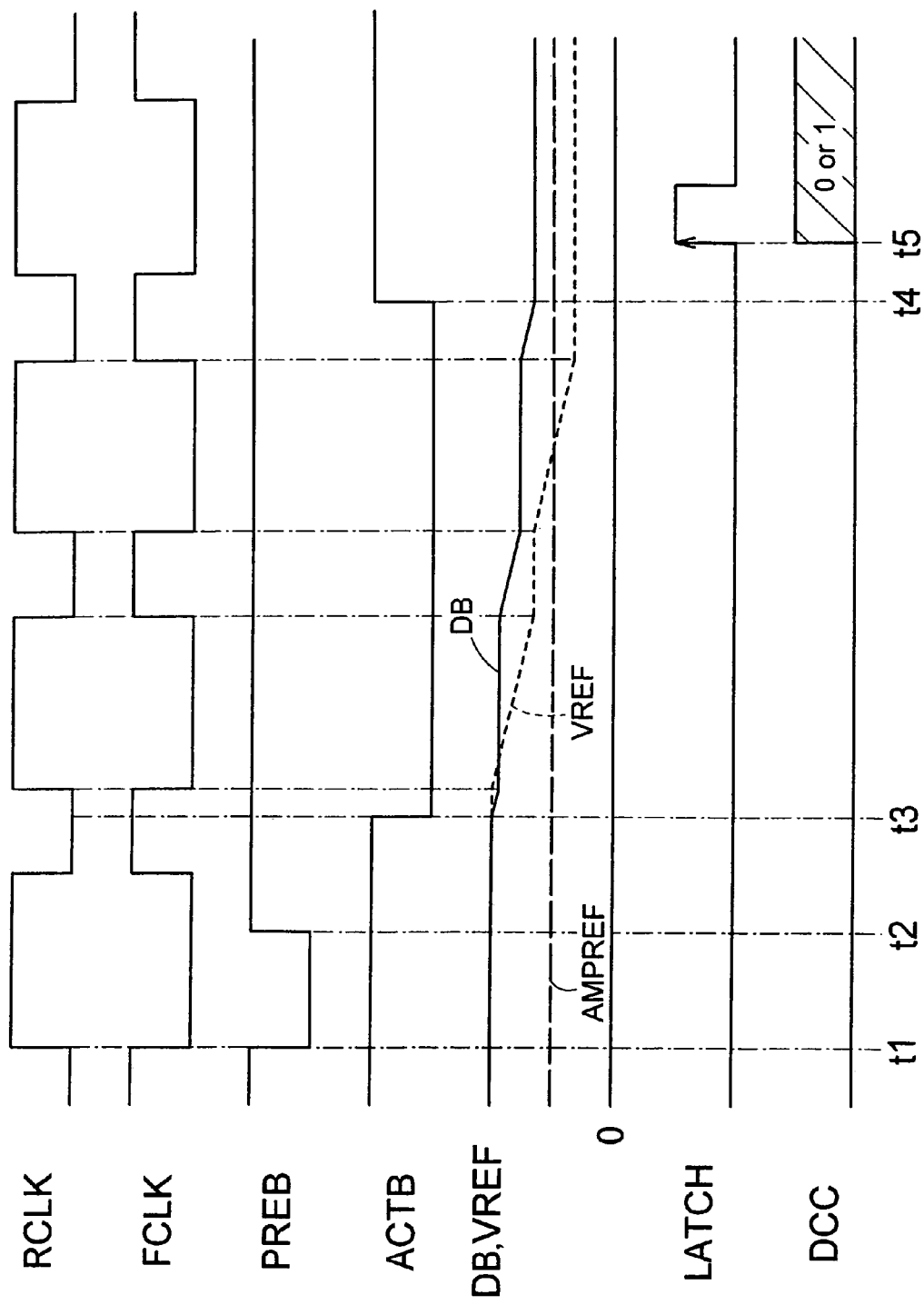
FIG. 3 is a waveform diagram of the operation of the integration circuit 110 in a case in which the duty ratio of the clock signal is greater than 50% (when the high-level time period of the RCLK signal is longer than the high-level time period of the FCLK signal).

FIG. 3 is a waveform diagram of the operation of the integration circuit 110 in a case in which the duty ratio of the clock signal is greater than 50% (when the high-level time period of the RCLK signal is longer than the high-level time period of the FCLK signal).

As shown in FIG. 3, since the pre-charge transistors Tr1 through Tr3 are all in the ON state when the PREB signal is active (Low) in the timing t1, feeding of a charge from the power source VCL is initiated. Since the activation transistors Tr4 and Tr5 are both in the OFF state when the ACTB signal is in the inactive (High) state, the current channel to the ground GND is blocked. All the charge from the power source VCL therefore flows to the capacitors C1 through C4, whereby the capacitors C1 and C3 are pre-charged. The pre-charge transistors Tr1 through Tr3 are all in the OFF state when the PREB signal then changes to the inactive (High) state in the timing $t_2$, and feeding of charge from the power source VCL is stopped.

Next, since the activation transistors Tr4 and Tr5 are both in the ON state when the ACTB signal is in the active (Low) state in the timing $t_3$, discharging of the charge charged into the capacitors C1 and C3 is initiated. At this time, the integration transistor Tr6 is ON during the time period in which the RCLK signal is active (High), and the integration transistor Tr7 is ON during the time period in which the FCLK signal is active (High). Therefore, the charge accumulated in the capacitor C1 during the time period in which the RCLK signal is active is discharged, and the charge accumulated in the capacitor C3 during the time period in which the FCLK signal is active is discharged. Since the RCLK signal and the FCLK signal in this arrangement are complementary signals, the charges charged into the capacitors C1 and C3 are released in alternating fashion. In FIG. 2, an example is shown in which the potential of the VREF signal first decreases due to the discharge of the capacitor C1, and then the potential of the DB signal decreases due to the discharge of the capacitor C3. The ACTB signal then changes to inactive (High) in the timing $t_4$ in which a certain time period (time period 2T in the present example) elapses, and the discharge operation is thereby completed. In other words, the integration operation time period ends.

In the present example, since the high-level time period of the RCLK signal is longer than the high-level time period of the FCLK signal, the discharging time of the capacitor C1 is longer than the discharging time of the capacitor C3. As a result, the potential of the VREF signal decreases more than the potential of the DB signal, as shown in FIG. 3.

The latch signal LATCH fed by the control circuit 140 in the timing $t_5$ then becomes active (High), and the output of the amplifier 120 is captured by the latch circuit 130 in response. The value captured by the latch circuit 130 is fed as the DCC signal to the main circuit unit of the DLL circuit not shown in the drawing. In the present example, since VREF<DB, the DCC signal becomes high-level, based on which the main circuit unit of the DLL circuit performs control so that the duty ratio of the clock signal decreases.

Figure 4:
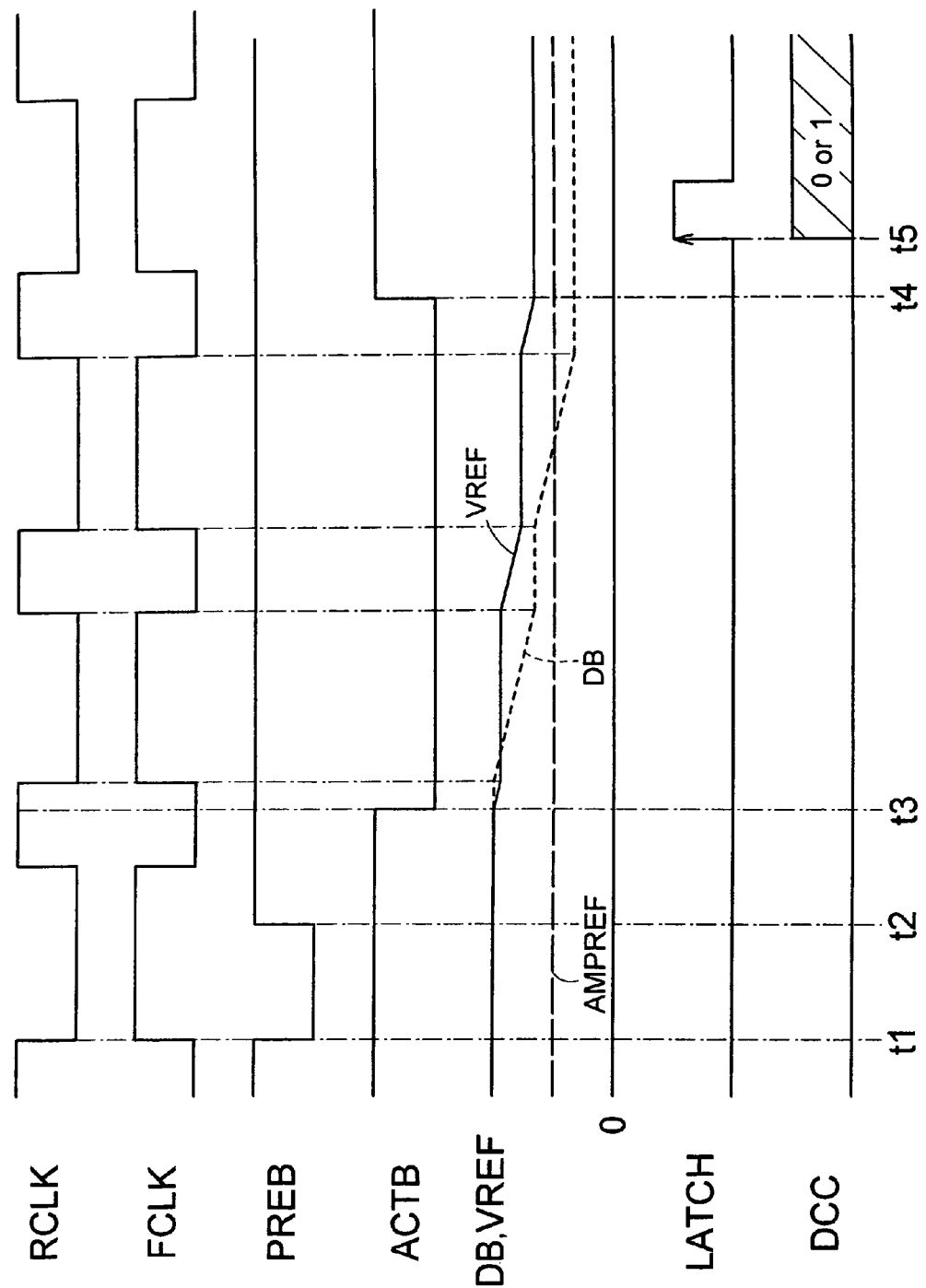
FIG. 4 is a waveform diagram showing the operation of the integration circuit 110 in a case in which the duty ratio of the clock signal is smaller than 50% (when the high-level time period of the RCLK signal is shorter than the high-level time period of the FCLK signal).

FIG. 4 is a waveform diagram showing the operation of the integration circuit 110 in a case in which the duty ratio of the clock signal is smaller than 50% (when the high-level time period of the RCLK signal is shorter than the high-level time period of the FCLK signal).

The basic operation is also as described above when the duty ratio of the clock signal is smaller than 50%. However, in the present example as shown in FIG. 4, since the high-level time period of the FCLK signal is longer than the high-level time period of the RCLK signal, the discharging time of the capacitor C3 is longer than the discharging time of the capacitor C1. As a result, the level of the DB signal decreases more than the level of the VREF signal, as shown in FIG. 4.

Therefore, since VREF>DB when the latch signal LATCH becomes active (High) in the timing $t_5$, the latch circuit 130 latches the low level and outputs it as the DCC signal. On this basis, the main circuit unit of the DLL circuit not shown in the drawing performs control so that the duty ratio of the clock signal increases.

The operation shown in FIGS. 3 and 4 is repeatedly executed during normal operation, enabling the DLL circuit to stabilize the duty ratio of the clock signal at about 50%.

The structure and operation of the integration circuit 110 are described above. The structure and operation of the frequency monitor circuit unit 160 will next be described. The frequency monitor circuit unit 160 is a circuit component used when the power source is turned on, during resetting, and when other initial settings. The frequency monitor circuit unit 160 detects the actual frequency of the clock signal and adjusts the characteristics of the integration circuit 110 so that duty error can be reliably detected based on this frequency detection.

As shown in FIG. 1, the frequency monitor circuit unit 160 comprises a first replica integration circuit 161 having the same structure as the integration circuit 110; an amplifier 162 for amplifying the output of the replica integration circuit 161; a latch circuit 163 for latching the output of the amplifier 162; the second replica integration circuit 164 having the same structure as the integration circuit 110 except for doubling (=2I) the amount of bias current by also presenting a BIAS signal to the gate of the bias transistor Tr10; an amplifier 165 for amplifying the output of the replica integration circuit 164; a latch circuit 166 for latching the output of the amplifier 165; and a determination circuit 167 for determining the frequency of the clock signal based on the output of the latch circuits 163 and 166.

The DBR1 signal that is the output signal of the first replica integration circuit 161, and the DBR2 signal that is the output signal of the second replica integration circuit 164 are both signals that correspond to the DB signal in the integration circuit 110. The DBR1 signal and DBR2 signal are fed to the amplifiers 162 and 165, respectively. The amplifiers 162 and 165 have the same characteristics as the amplifier 120, the latch circuits 163 and 166 have the same characteristics as the latch circuit 130, and the other input signal for the amplifiers 162 and 165 is an AMPREF signal rather than the VREF signal. Specifically, the signal lines S1 of the first and second replica integration circuits 161 and 164 are both open ends. The AMPREF signal is set to the level at which the sensitivity of the amplifiers is best.

The potential difference between the AMPREF signal and the DBR1 signal outputted by the first replica integration circuit 161 is latched by the latch circuit 163 after being amplified by the amplifier 162, and a DCCR1 signal is obtained that is a replica of the DCC signal. The DCCR1 signal is a 1-bit digital signal that is high-level ("1") when AMPREF<DBR1, and is low-level ("0") when AMPREF>DBR1, for example. In the same manner, the potential difference between the AMPREF signal and the DBR2 signal outputted by the second replica integration circuit 164 is latched by the latch circuit 166 after being amplified by the amplifier 165, and a DCCR2 signal is obtained that is a replica of the DCC signal. The DCCR2 signal is high-level when AMPREF<DBR2, and is low-level when AMPREF>DBR2, for example.

The determination circuit 167 performs the final determination of the frequency of the clock signal based on the DBR1 signal and the DBR2 signal. As described above, the DCCR1 signal is a digital value indicating the result of determining the potential level relationship between the DBR1 signal and the AMPREF signal, and the DCCR2 signal is a digital value indicating the result of determining the potential level relationship between the DBR2 signal and the AMPREF signal. Therefore, it can be determined that the DBR1 signal and the DBR2 signal are both lower than the AMPREF signal when the DCCR1 signal and the DCCR2 signal are "00," and when these signals are "11," it can be determined that the DBR1 signal and the DBR2 signal are both higher than the AMPREF signal. When these signals are "10," it can be determined that the DBR1 signal is higher than the AMPREF signal, and the DBR2 signal is lower than the AMPREF signal.

The method of determination by the frequency monitor circuit unit 160 based on the relationship between the DBR1 signal and the AMPREF signal, and on the relationship between the DBR2 signal and the AMPREF signal will next be described in further detail with reference to FIGS. 5 through 7.

Figure 5:
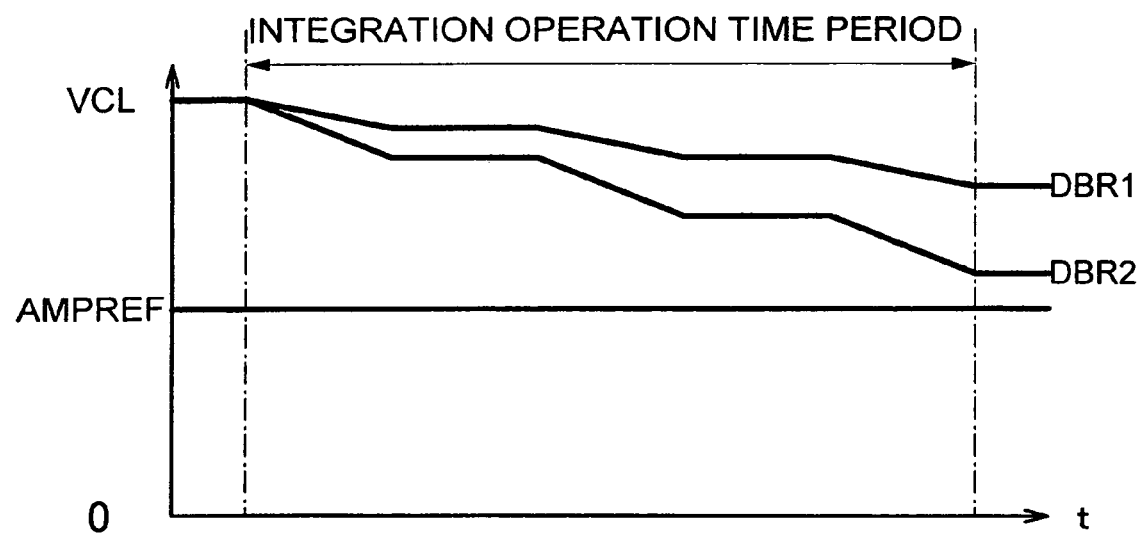
FIG. 5 is a waveform diagram of the DBR1 signal and DBR2 signal in a case in which the frequency of the clock signal is too high.

FIG. 5 is a waveform diagram of the DBR1 signal and DBR2 signal in a case in which the frequency of the clock signal is too high.

As shown in FIG. 5, when the final potentials (potentials after the integration operation time period has elapsed; the same hereinafter) of the DBR1 signal and DBR2 signal are both higher than the potential (0.7 V, for example) of the AMPREF signal, the determination circuit 167 determines that the frequency of the clock signal is too high. In other words, in this case, the determination circuit 167 determines that the frequency of the clock signal is equal to or higher than a "first frequency" that is higher than the reference frequency. The term "reference frequency" herein refers to the clock signal frequency specified by the circuit design, and is a value substantially in the middle of the frequency range of the clock signal at which the amplifier 120 operates correctly. In terms of the relationship between the first frequency and the second frequency described hereinafter, the reference frequency is an intermediate value roughly between the "first frequency" and the "second frequency." The "first frequency" also defines the maximum of the frequency range of the clock signal at which the amplifier 120 operates correctly. When such a determination is made, the determination circuit 167 activates a CNTL1 signal that is a control signal. When the CNTL1 signal is activated, the bias circuit 150 that receives the same changes (increases) the potential of the BIAS signal so that the amount of bias current flowing to the integration circuit 110 is twice (=2I) the amount of current at the time of the initial setting state, for example. Since the discharging rate of the capacitors C1 and C3 is thereby increased, the potentials of the DB signal and the VREF signal after the integration operation time period has elapsed decrease to the level of the high-sensitivity operating range of the amplifier 120, and the potential difference between the DB signal and the VREF signal is magnified.

Figure 6:
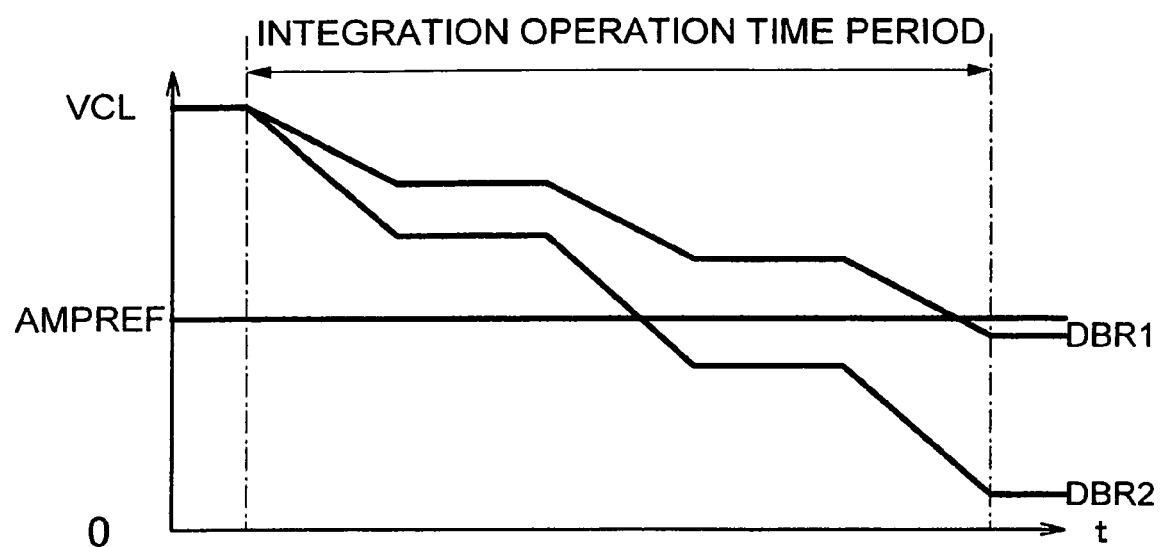
FIG. 6 is a waveform diagram of the DBR1 signal and DBR2 signal in a case in which the frequency of the clock signal is too low.

FIG. 6 is a waveform diagram of the DBR1 signal and DBR2 signal in a case in which the frequency of the clock signal is too low.

As shown in FIG. 6, when the final potentials of the DBR1 signal and DBR2 signal are both lower than the potential of the AMPREF signal, the determination circuit 167 determines that the frequency of the clock signal is too low. In other words, in this case, the determination circuit 167 determines that the frequency of the clock signal is equal to or lower than a "second frequency" that is lower than the reference frequency. The "second frequency" herein defines the minimum of the frequency range of the clock signal at which the amplifier 120 operates correctly. When such a determination is made, the determination circuit 167 activates a CNTL2 signal that is a control signal. When the CNTL2 signal is activated, the control circuit 140 that receives the same shortens the time period in which the ACTB signal becomes low-level; specifically, the integration operation time period. For example, when the integration operation time period in the initial setting state is equal to two cycles (=2T) of the clock signal, the integration operation time period is shortened to one cycle (=1T) of the clock signal when the CNTL2 signal is activated. Since the discharging time of the capacitors C1 and C3 is thereby reduced, the levels of the DB signal and VREF signal after the integration operation time period has elapsed can be placed at levels that are within the high-sensitivity operating range of the amplifier 120.

Figure 7:
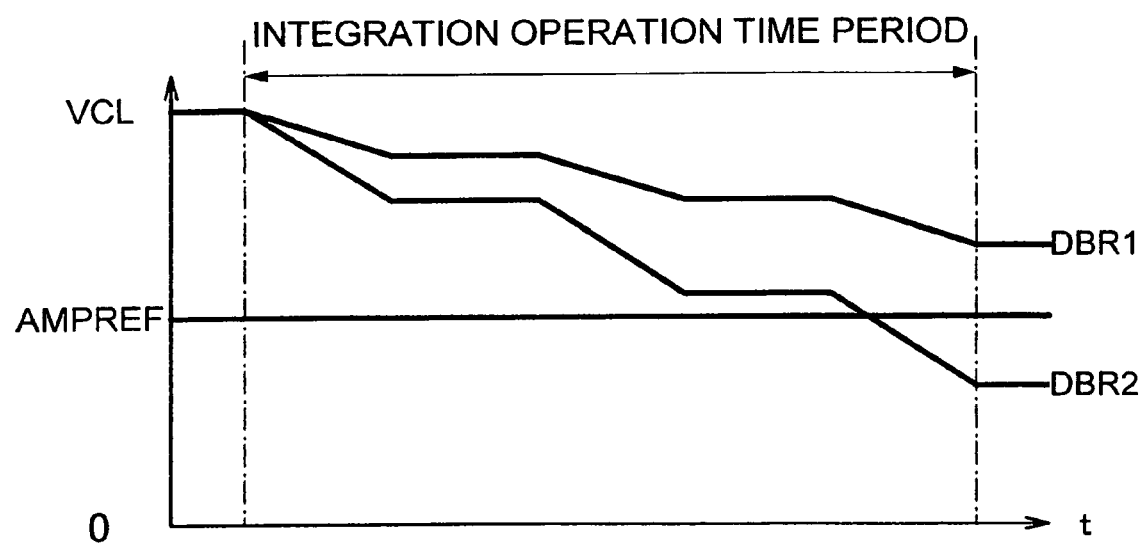
FIG. 7 is a waveform diagram of the DBR1 signal and DBR2 signal in a case in which the frequency of the clock signal is appropriate.
Figure 8:
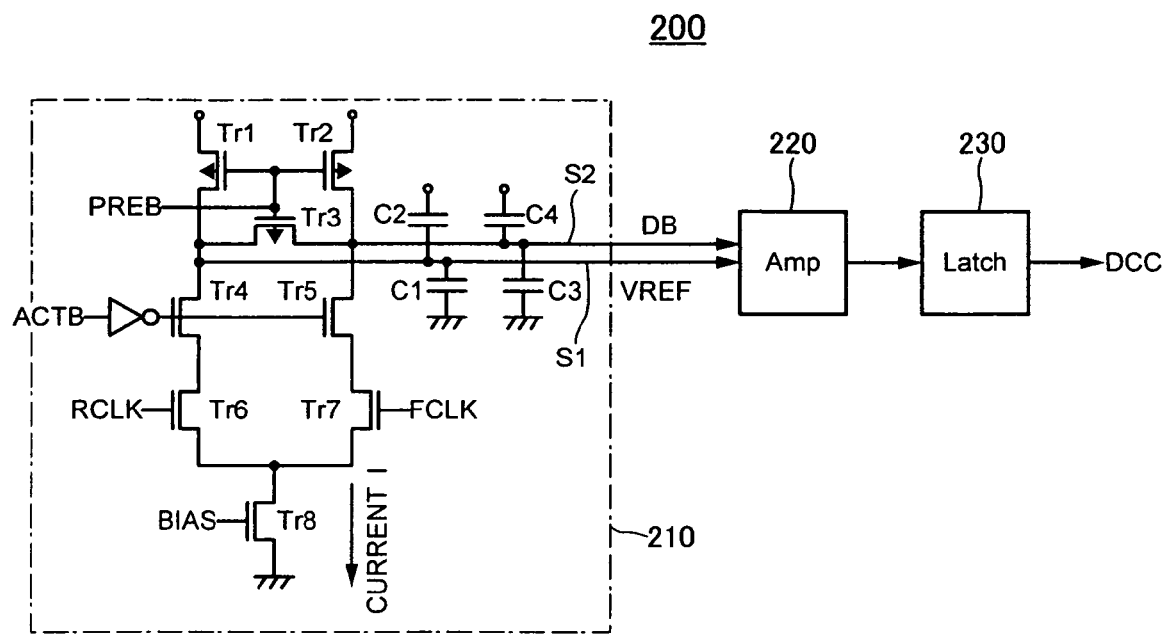
FIG. 8 is a simplified block diagram showing the structure of a conventional duty detection circuit.
Figure 9:
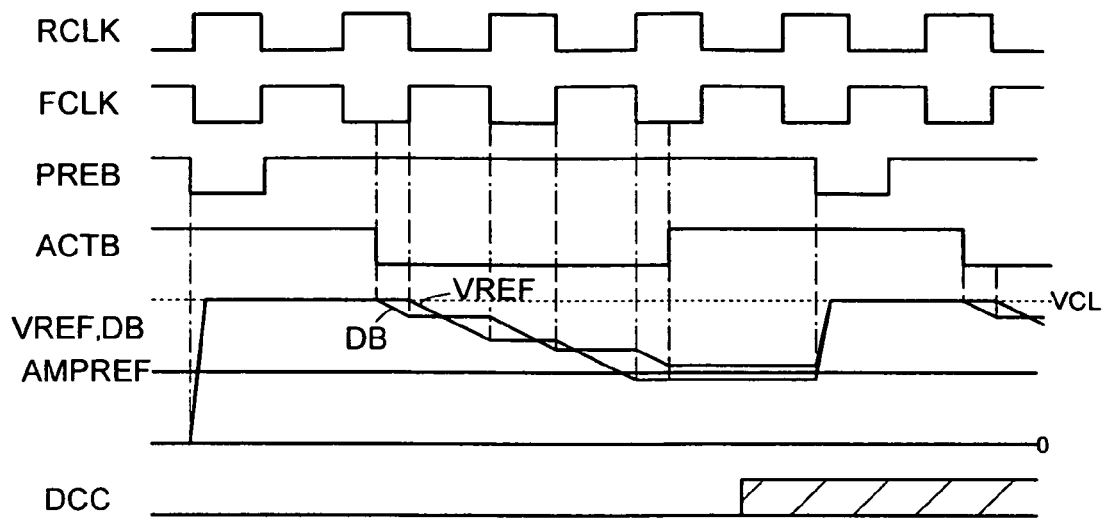
FIG. 9 is a waveform diagram showing the operation of the duty detection circuit 200 when the frequency of the clock signal is appropriate.
Figure 10:
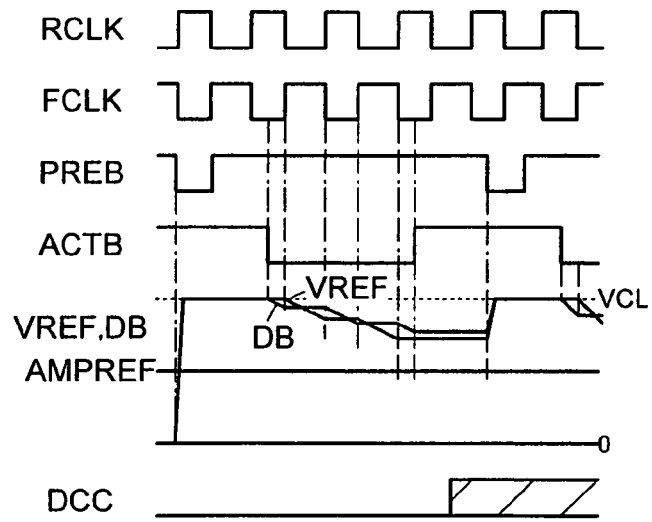
FIG. 10 is a waveform diagram showing the operation of the duty detection circuit 200 when the frequency of the clock signal is too high.
Figure 11:
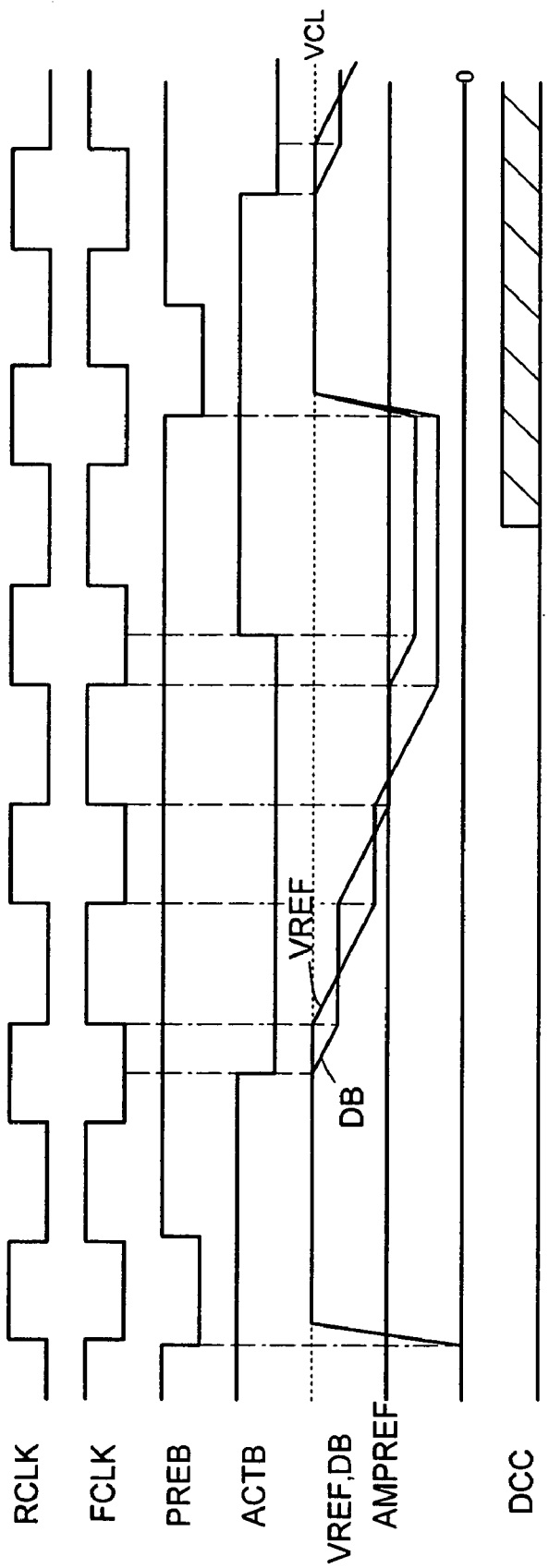
FIG. 11 is a waveform diagram showing the operation of the duty detection circuit 200 when the frequency of the clock signal is too low.

FIG. 7 is a waveform diagram of the DBR1 signal and DBR2 signal in a case in which the frequency of the clock signal is appropriate.

As shown in FIG. 7, when the final potential of the DBR1 signal is higher than the level of the AMPREF signal, and the final potential of the DBR2 signal is lower than the level of the AMPREF signal, the determination circuit 167 determines that the frequency of the clock signal is appropriate and therefore the setting state remains unchanged. In other words, neither the CNTL1 signal nor the CNTL2 signal is activated when the frequency of the clock signal is within the range from the first frequency to the second frequency. The integration circuit 110 thereby operates in the initial setting state with no change to the amount of bias current and the integration operation time period.

This type of operation is executed when the power source is turned on, during resetting, and when other initial settings are performed, and it thereby becomes possible for the integration circuit 110 to obtain the appropriate characteristics according to the actual clock signal frequency. In other words, it becomes possible to correctly detect duty error even when the actual frequency of the clock signal differs from the assumed frequency. The frequency determination in the method shown in FIGS. 5 through 7 is not performed by the determination circuit 167 independently, but is performed by cooperation with the amplifiers 162 and 165 and the latch circuits 163 and 166. Specifically, the frequency determination based on the DBR1 signal is performed by the amplifier 162 and the latch circuit 163; the frequency determination based on the DBR2 signal is performed by the amplifier 165 and the latch circuit 166; and the final frequency determination based on the results of these separate determinations is performed by the determination circuit 167.

As described above, the duty detection circuit 100 according to the present embodiment comprises a frequency monitor circuit unit 160 for detecting the actual frequency of the clock signal, and since the amount of discharging of the capacitors C1 and C3 included in the integration circuit 110 is adjusted according to the detection result. Accordingly, frequency dependency is alleviated, and normal use becomes possible in a wider frequency bandwidth.

The integration operation time period is also not excessively lengthened in the present embodiment, because the amount of discharging of the capacitors C1 and C3 is adjusted by adjusting the amount of bias current when the amount of discharging of the capacitors C1 and C3 must be increased (when the frequency of the clock signal is too high). When the amount of discharging of the capacitors C1 and C3 must be decreased (when the frequency of the clock signal is too low), since the amount of discharging of the capacitors C1 and C3 is adjusted by adjusting the integration operation time period, there is also no decrease in detection error due to decreased bias current.

The present invention has thus been shown and described with reference to specific embodiments. However, it should be noted that the present invention is in no way limited to the details of the described arrangements but changes and modifications may be made without departing from the scope of the appended claims.

For example, in the above embodiment, the bias current is increased when the frequency of the clock signal is too high, and the integration operation time period is shortened when the frequency of the clock signal is too low. However, the present invention is not limited by this embodiment insofar as the amount of charging or discharging of the capacitors included in the integration circuit is adjusted according to the frequency of the clock signal. Consequently, the amount of charging or discharging of the capacitors may be adjusted by increasing the bias current when the frequency of the clock signal is too high, and by decreasing the bias current when the frequency of the clock signal is too low. The amount of charging or discharging of the capacitors may also be adjusted by lengthening the integration operation time period when the frequency of the clock signal is too high, and shortening the integration operation time period when the frequency of the clock signal is too low.

In the above embodiment, the amount of discharging is adjusted both when the frequency of the clock signal is too high, and when the frequency of the clock signal is too low. However, the amount of charging or discharging of the capacitors may also be adjusted only when the frequency of the clock signal is too high, or only when the frequency of the clock signal is too low.

In the above embodiment, the frequency is determined to be in one of three levels that include the range from the first frequency to the second frequency, the first frequency or higher, and the second frequency or lower, but the frequency determination may include two levels, four levels, or more levels.

In the above embodiment, the frequency is detected using two replica integration circuits. However, the present invention is not limited by this embodiment, and the frequency may be detected using one replica integration circuit, or the frequency may be detected without the use of a replica integration circuit. An example of a possible method for detecting the frequency using one replica integration circuit involves dispensing with the first replica integration circuit 161 used in the above embodiment, and causing the function thereof to be taken over by the integration circuit 110. An example of a possible method for detecting the frequency without the use of a replica integration circuit involves dispensing with the first replica integration circuit 161 and second replica integration circuit 164 used in the embodiment described above, and making various changes to the bias current flowing to the integration circuit 110, or making various changes to the integration operation time period, and detecting the frequency based on the levels of the DB signal and/or VREF signal thereby obtained.

In the above embodiment, the two capacitors C1 and C2 are connected to the signal line S1, and the two capacitors C3 and C4 are connected to the signal line S2, but the capacitors C1 and C3 or capacitors C2 and C4 may also be omitted. When the capacitors C1 and C3 are omitted, duty error is detected according to the amount of charging of the capacitors C2 and C4 in the integration operation time period. When the capacitors C2 and C4 are omitted, duty error is detected according to the amount of discharging of the capacitors C1 and C3 in the integration operation time period.

As described above, According to the present invention, since the amount of charging or discharging of the first and second capacitors included in the integration circuit is adjusted in the present invention based on the actual frequency of the clock signal, frequency dependency is alleviated and normal use becomes possible in a wider frequency bandwidth.

What is claimed is:

1. A semiconductor device with a duty detection circuit, the duty detection circuit comprising:
   an integration circuit including a first capacitor charged or discharged in response to a first clock signal;
   a monitor circuit including a second capacitor and a first circuit charging or discharging the second capacitor in response to the first clock signal; and
   a control circuit controlling the integration circuit to adjust an amount of charging or discharging of the first capacitor in response to a voltage of the second capacitor.

2. The device as claimed in claim 1, wherein the second capacitor is substantially equal capacitance value to the first capacitor.

3. The device as claimed in claim 1, further comprising first amplifier circuit amplifying a potential difference between a voltage of the first capacitor and a first reference voltage and wherein the monitor circuit has a second amplifier circuit amplifying a potential difference between the voltage of the second capacitor and a second reference voltage.

4. The device as claimed in claim 3, wherein the second amplifier circuit has is substantially equal characteristic to the first amplifier circuit.

5. The device as claimed in claim 3, wherein the control circuit supplies the second reference voltage to the second amplifier circuit and the second reference voltage is set to a voltage level at which the first amplifier operates correctly.

6. The device as claimed in claim 1, wherein an amount of charging or discharging of the second capacitor is different from the amount of charging or discharging of the first capacitor.

7. The device as claimed in claim 1, wherein a charging rate or a discharging rate of the second capacitor is different from a charging rate or a discharging rate of the first capacitor.

8. The device as claimed in claim 1, wherein the monitor circuit includes a detection circuit outputting a control signal to the control circuit in response to a voltage of the second capacitor and the control circuit controlling the integration circuit to adjust an amount of charging or discharging of the first capacitor in response to a voltage of the control signal.

9. The device as claimed in claim 1, wherein the monitor circuit includes a plurality of third capacitors and a plurality of second circuits each provided for a corresponding to the third capacitors, each of the second circuits charging or discharging the corresponding one of the third capacitors in response to the first clock signal and the control circuit controlling the integration circuit to adjust an amount of charging or discharging of the first capacitor in response to voltages of the second capacitor and the plurality of third capacitors.

10. The device as claimed in claim 9, wherein charging rates or discharging rates of the third capacitors are different from each other.

11. The device as claimed in claim 9, wherein a charging rate or a discharging rate of the second capacitor is equal to a charging rate or discharging rate of the first capacitor and is different from a charging rate or a discharging rate of the each of the third capacitors.

12. The device as claimed in claim 9, further comprising a first amplifier circuit amplifying a potential different between a voltage of the first capacitor and a first reference voltage, and wherein the monitor circuit has a second amplifier circuit amplifying a potential difference between a voltage of the second capacitor and a second reference voltage and a plurality of third amplifier circuits each provided for a corresponding to the third capacitors, each of the third amplifier circuits amplifies a potential difference between a voltage of the corresponding one of the third capacitors and the second reference voltage.

13. The device as claimed in claim 12, wherein the second amplifier circuit and the plurality of third amplifier circuits have the same characteristics as the first amplifier circuit.

14. The device as claimed in claim 1, wherein the control circuit includes a first control circuit adjusting a charging rate or a discharging rate of the first capacitor in response to the voltage of the second capacitor.

15. The device as claimed in claim 1, wherein the control circuit includes a second control circuit adjusting a charging period or a discharging period of the first capacitor in response to the voltage of the second capacitor.

16. The device as claimed in claim 15, wherein the second control circuit controls operations of the integration circuit and monitor circuit.

17. A semiconductor device with a duty detection circuit, the duty detection circuit comprising:
   a first circuit including a first transistor coupled between a first circuit node and a second circuit node, a control electrode of the first transistor receiving a first clock signal, a first capacitor coupled between the first circuit node and a first power source line, a second transistor coupled between the second circuit node and the first power source line;

a second circuit including a third transistor coupled between a third circuit node and a fourth circuit node and a control electrode of the third transistor receiving the first clock signal, a second capacitor coupled between the third circuit node and the first power source line, and a fourth transistor coupled to the fourth circuit node and the first power source line; and a first control circuit having an output node coupled to a control terminal of the second transistor and outputting a first voltage in response to a voltage of the second capacitor to the output node thereof.

18. The device as claimed in claim 17, wherein the first circuit including a fifth transistor coupled between the first circuit node and the first transistor and the duty detection circuit further comprising a second control circuit having an output node coupled to a control terminal of the fifth transistor outputting a control signal in response to the voltage of the second capacitor to the output node thereof.

19. The device as claimed in claim 17, further including a third circuit including a fifth transistor coupled between a sixth circuit node and a seventh circuit node and a control electrode of the seventh transistor receiving the first clock signal, third capacitor coupled between the sixth circuit node and the first power source line, and sixth and seventh transistors coupled between the seventh circuit node and the first power source line, the output node of the first control circuit coupled to control terminals of the second, the fourth, the sixth and the seventh transistors and the first control circuit outputs the first voltage in response to voltages of the second and third capacitors to the output node thereof.

20. The device as claimed in claim 17, wherein the first circuit including a fifth transistor coupled to a fifth circuit node and the second circuit node, a control electrode of the fifth transistor receiving a second clock signal having an opposite phase of the first clock signal, a third capacitor coupled to the fifth circuit node and the first power source line and the second circuit including a sixth transistor coupled to a sixth circuit node and the fourth circuit node and a control electrode of the sixth transistor receiving the second clock signal.

\* \* \* \* \*